(12) United States Patent
Izawa et al.

(10) Patent No.: US 7,339,646 B2
(45) Date of Patent: Mar. 4, 2008

(54) CONNECTION STRUCTURES OF WIRING BOARD AND CONNECTION STRUCTURE OF LIQUID CRYSTAL DISPLAY PANEL

(75) Inventors: Mamoru Izawa, Toyohashi (JP); Tsuyoshi Ishigame, Matto (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 79 days.

(21) Appl. No.: 10/532,706

(22) PCT Filed: Oct. 28, 2002

(86) PCT No.: PCT/JP02/11172

§ 371 (c)(1),
(2), (4) Date: Dec. 12, 2005

(87) PCT Pub. No.: WO2004/038495

PCT Pub. Date: May 6, 2004

(65) Prior Publication Data

US 2006/0146261 A1  Jul. 6, 2006

(51) Int. Cl.
*G02F 1/1345* (2006.01)
(52) U.S. Cl. .................................... 349/150
(58) Field of Classification Search .............. 349/150
See application file for complete search history.

(56) References Cited

U.S. PATENT DOCUMENTS

| | | | | |
|---|---|---|---|---|
| 4,058,970 A | * | 11/1977 | Ichinose | 368/156 |
| 4,842,373 A | * | 6/1989 | Tomofuji et al. | 349/150 |
| 5,358,412 A | * | 10/1994 | Maurinus et al. | 439/66 |
| 5,404,239 A | * | 4/1995 | Hirai | 349/150 |
| 5,680,191 A | * | 10/1997 | Voisin et al. | 349/150 |
| 6,614,499 B1 | * | 9/2003 | Petruchik | 349/149 |
| 6,714,275 B2 | * | 3/2004 | Tsai | 349/149 |
| 6,744,638 B2 | * | 6/2004 | Terasaka | 361/803 |
| 6,795,152 B2 | * | 9/2004 | Tsai | 349/149 |
| 6,806,936 B2 | * | 10/2004 | Nakaminami et al. | 349/149 |
| 6,903,794 B2 | * | 6/2005 | Fukuta et al. | 349/150 |

FOREIGN PATENT DOCUMENTS

| | | |
|---|---|---|
| JP | 1-237520 | 9/1989 |
| JP | 01-237520 | 9/1989 |
| JP | 06-003657 | 1/1994 |
| JP | 6-3657 | 1/1994 |

(Continued)

*Primary Examiner*—James A. Dudek
(74) *Attorney, Agent, or Firm*—McDermott Will & Emery LLP

(57) ABSTRACT

A liquid crystal display device of the present invention comprises a liquid crystal display panel (1) provided with one or more electrode terminals ($R_1$) to ($R_n$) and a pair of reference markers (N1) on a non-display region (3) thereof, a flexible printed circuit board (FPC1) provided with alignment markers (M2) corresponding to the reference markers, and a printed circuit board (PCB1) having one or more electrode terminals ($T_1$) to ($T_n$), the reference markers being located inward relative to the alignment markers and the electrode terminals of the liquid crystal display panel and the electrode terminals of the printed circuit board being connected to each other through wiring ($P_1$) to ($P_n$) of the flexible printed circuit board, wherein the alignment markers are elongated holes having long axes at least in one direction.

8 Claims, 11 Drawing Sheets

FOREIGN PATENT DOCUMENTS

| | | |
|---|---|---|
| JP | 6-308515 | 11/1994 |
| JP | 06-308515 | 11/1994 |
| JP | 8-114811 | 5/1996 |
| JP | 08-114811 | 5/1996 |
| JP | 09-189916 | 7/1997 |
| JP | 9-189916 | 7/1997 |
| JP | 10-311984 | 11/1998 |
| JP | 2001-183692 | 7/2001 |
| JP | 2001-188243 | 7/2001 |
| JP | 2002-329941 | 11/2002 |

* cited by examiner

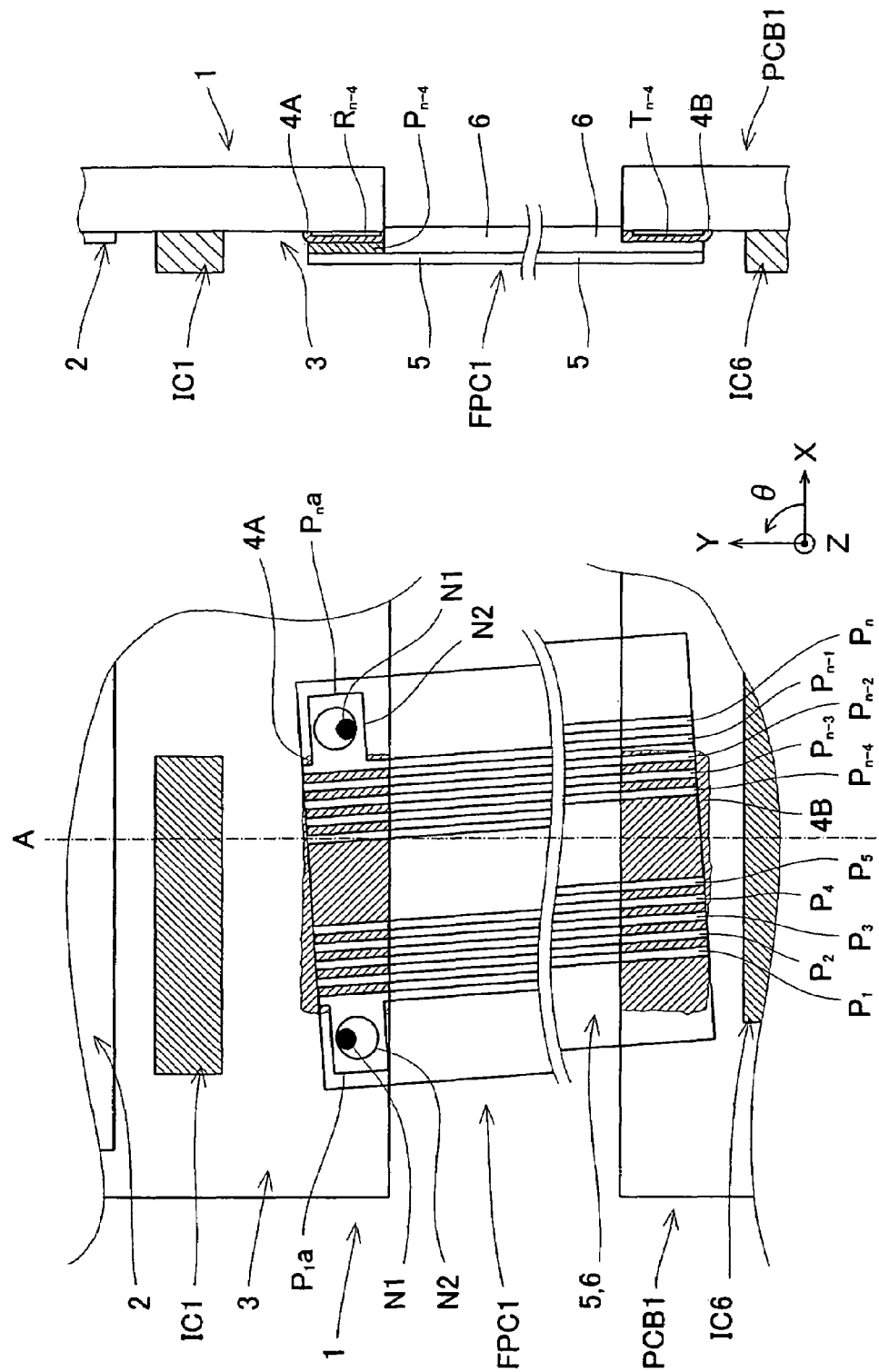

US 7,339,646 B2

CONNECTION STRUCTURES OF WIRING BOARD AND CONNECTION STRUCTURE OF LIQUID CRYSTAL DISPLAY PANEL

TECHNICAL FIELD

The present invention relates to a liquid crystal display device in which a liquid crystal display panel is mounted.

BACKGROUND ART

Since microfabrication technology, material technology, and mounting technology have made progress in recent years, a liquid crystal display device characterized by light weight, thinness and small power consumption has been widely used as an image display device which replaces a Braun tube, in a variety of devices such as an audio-visual device, an office automation device, an in-vehicle device, an information-communication device and the like. A liquid crystal display module is mounted in these liquid crystal display devices for processing a driving signal to display an image.

In general, the liquid crystal display module comprises a liquid crystal display panel, a printed circuit board, and a flexible printed circuit board, and typically has a structure in which the liquid crystal display panel and the printed circuit board are electrically connected to each other by means of the flexible printed circuit board.

FIG. 12 is a view schematically showing a general structure of a liquid crystal display module L.

The liquid crystal display module L illustrated in FIG. 12 comprises a liquid crystal display panel 1 for displaying an image according to an applied driving signal, flexible printed circuit boards FPC1 to FPC4 for transmitting the driving signal to the liquid crystal display panel 1, and a printed circuit board PCB1 for processing the driving signal of the liquid crystal display panel L. The liquid crystal display panel 1 is provided with a display region 2 for displaying an image, and a non-display region 3 around the display region 2. And, driving semiconductor devices IC1 to IC5 are mounted at predetermined positions of the non-display region 3 for directly driving the liquid crystal display panel 1. Also, driving semiconductor devices IC6 to IC9 are mounted at predetermined positions of the printed circuit board PCB1 for processing the driving signal for driving the liquid crystal display panel 1. And, the liquid crystal display panel 1 and the printed circuit board PCB1 are integrated with each other by electrically connecting electrode terminals (not shown) formed on each of them by means of the flexible printed circuit boards FPC1 to FPC4. Herein, electrical connections between the liquid crystal display panel 1 and the flexible printed circuit boards FPC1 to FPC4 and between the flexible printed circuit boards FPC1 to FPC4 and the printed circuit board PCB1 are performed by electrically connecting electrode terminals to one another by means of an anisotropic conductive adhesive or the like. First, the flexible printed circuit boards FPC1 to FPC4 are bonded to the liquid crystal display panel 1, and then the flexible printed circuit boards FPC1 to FPC4 are bonded to the printed circuit board PCB1. A COG (Chip On Glass) mounting process in which the driving semiconductor devices IC1 to IC5 are directly mounted on the electrode terminals provided on a surface of the liquid crystal display panel 1 is commonly used as a process for mounting the driving semiconductor devices IC1 to IC5 on the surface of the liquid crystal display panel 1. As an alternative process for mounting the driving semiconductor devices IC1 to IC5, there is a TCP (Tape Carrier Package) mounting process in which a film board obtained by mounting the driving semiconductor devices IC1 to IC5 on a surface of a tape-shaped film wiring board provided with a predetermined wiring pattern is mounted on the surface of the liquid crystal display panel 1, a COF (Chip On Flexible) mounting process, a COP (Chip On Plastic) mounting process and the like, in which a flexible board obtained by mounting the driving semiconductor devices IC1 to IC5 on the flexible printed circuit board made of plastic is mounted on the surface of the liquid crystal display panel 1, for example. However, since the driving signal of the liquid crystal display panel increases as definition of a liquid crystal display device becomes higher, the COG mounting process is commonly used for reducing the electrode terminals formed on the liquid crystal display panel 1.

FIGS. 13(a) and 13(b) are enlarged schematic views showing the flexible printed circuit board FPC1 and the vicinity thereof of the liquid crystal display module L illustrated in FIG. 12, in which FIG. 13(a) is a plan view and FIG. 13(b) is a cross-sectional view taken along line A-A' in FIG. 13(a). And, FIGS. 14(a) and 14(b) are views illustrated in association with the schematic views shown in FIGS. 13(a) and 13(b), schematically showing a condition before the liquid crystal display panel 1 and the printed circuit board PCB1 are integrated with each other by means of the flexible printed circuit board FPC1, in which FIG. 14(a) is a plan view and FIG. 14(b) is a cross-sectional view taken along line A-A' in FIG. 14(a).

Hereinafter, the electrical connection between the liquid crystal display panel 1 and the printed circuit board PCB1 by means of the flexible printed circuit board FPC1 will be described with reference to FIGS. 13(a), 13(b) and FIGS. 14(a), 14(b). The flexible printed circuit board FPC1 in FIGS. 13(a), 13(b) and FIGS. 14(a), 14(b) is perspectively shown. X-axis, Y-axis, and Z-axis directions (Z-axis direction is a direction perpendicular to a drawing surface) in FIGS. 13(a), 13(b) and FIGS. 14(a), 14(b) are defined as shown in the drawings. As a matter of convenience, hereinbelow, it is assumed that a longitudinal direction and a lateral direction of the display region 2 of the liquid crystal display panel 1 conform to X-axis direction and Y-axis direction, respectively, in this embodiment.

As shown in FIGS. 13(a), 13(b) and FIGS. 14(a), 14(b), herein, the flexible printed circuit board FPC1 is rectangular and has a three-layer structure in which wiring patterns $P_1$ to $P_n$ obtained by forming copper foil in a predetermined shape by etching or the like, a cover film 5, and a base film 6 each of which is made of semi-transparent insulative resin such as polyimide are laminated. The wiring patterns $P_1$ to $P_n$ are formed to extend from one side of the flexible printed circuit board FPC1, which is parallel to X-axis direction, to the other side thereof to have substantially constant pattern widths and pattern spacings. And, rectangular conductive patterns $P_1a$ and $P_na$ extend in opposite directions from side portions of the wiring patterns $P_1$ and $P_n$ on the liquid crystal display panel 1 side to be each spaced a predetermined distance apart from an end of the flexible printed circuit board FPC1. Furthermore, predetermined circular alignment markers N2 are formed on the conductive patterns $P_1a$ and $P_na$. And, as shown in FIG. 14(b), in the flexible printed circuit board FPC1, the base film 6 is rectangular shaped to have sides substantially parallel to two sides of the flexible printed circuit board FPC1 which are parallel to X-axis direction, with a predetermined distance therefrom. Thereby, end portions of the wiring patterns $P_1$ to $P_n$ are exposed so as to be electrically connected to external electrode terminals.

As shown in FIGS. 13(a) and 13(b), one end portion of the flexible printed circuit board FPC1 provided with the alignment markers N2 is bonded to a predetermined position of the liquid crystal display panel 1 by means of an anisotropic conductive adhesive 4A, after predetermined alignment with the liquid crystal display panel 1 to be described below is performed. As shown in FIG. 14(a), rectangular electrode terminals $R_1$ to $R_n$ for applying the driving signal to the liquid crystal display panel 1 are formed on a surface of the non-display region 3 of the liquid crystal display panel 1, which is covered with the anisotropic conductive adhesive 4A, at positions corresponding to the wiring patterns $P_1$ to $P_n$ of the flexible printed circuit board FPC1, so as to be substantially parallel to each other. Therefore, one end portions of the wiring patterns $P_1$ to $P_n$ provided on the flexible printed circuit board FPC1 are electrically connected to the corresponding electrode terminals $R_1$ to $R_n$ of the liquid crystal display panel 1. And, as shown in FIGS. 13(a) and 13(b), the other end portion of the flexible printed circuit board FPC1 is bonded to a predetermined position of the printed circuit board PCB1 by means of an anisotropic conductive adhesive 4B without special alignment with the printed circuit board PCB1, after the liquid crystal display panel 1 and the printed circuit board PCB1 are disposed so as to be in a predetermined positional relationship. As shown in FIG. 14(a), rectangular electrode terminals $T_1$ to $T_n$ for outputting the driving signal to the flexible printed circuit board FPC1 are formed on a surface of the printed circuit board PCB1, which is covered with the anisotropic conductive adhesive 4B, at positions corresponding to the wiring patterns $P_1$ to $P_n$ of the flexible printed circuit board FPC1, so as to be substantially parallel to each other. Therefore, the other end portions of the wiring patterns $P_1$ to $P_n$ provided on the flexible printed circuit board FPC1 are electrically connected to the corresponding electrode terminals $T_1$ to $T_n$ of the printed circuit board PCB1.

Hereinafter, an alignment process performed when the flexible printed circuit boards FPC1 to FPC4 are bonded to the liquid crystal display panel 1 will be described.

As shown in FIG. 14(a), two predetermined circular reference markers N1 are formed on the liquid crystal display panel 1, with a predetermined distance from a side of the liquid crystal display panel 1 which is near these markers N1. And, two predetermined circular alignment markers N2 are formed on the flexible printed circuit board FPC1 at positions corresponding to the reference markers N1 provided on the liquid crystal display panel 1. And, the alignment of the flexible printed circuit board FPC1 with the liquid crystal display panel 1 is performed manually or by an automatic alignment device or the like such that the centers of the alignment markers N2 and those of the reference markers N1 preferably conform to each other as shown in FIG. 13(a), or the reference markers N1 are located at least inward relative to the alignment markers N2. A diameter of the alignment markers N2 is preferably substantially equal to that of the reference markers N1 so as to prevent misalignment of the flexible printed circuit board FPC1 with the liquid crystal display panel 1 occurring when the flexible printed circuit board FPC1 is bonded to the liquid crystal display panel 1. However, in that case, recognition of relative positions of the alignment markers N2 with respect to the reference markers N1 becomes difficult, and consequently, it becomes difficult to efficiently perform the alignment between the liquid crystal display panel 1 and the flexible printed circuit FPC1. Accordingly, actually, as shown in FIGS. 13(a), 13(b) and FIGS. 14(a), 14(b), the diameter of the alignment markers N2 is made slightly larger than that of the reference markers N1 within a range in which the liquid crystal display panel 1 and the printed circuit board PCB1 are properly electrically connected to each other even when the bonding position of the flexible printed circuit board FPC1 is out of alignment in the above-described alignment process.

In the above-structured liquid crystal display module L, the driving signal processed at the driving semiconductor devices IC6 to IC9 is guided to the electrode terminals $T_1$ to $T_n$ formed on the printed circuit board PCB1, furthermore, guided through the flexible printed circuit boards FPC1 to FPC4 to reach the electrode terminals $R_1$ to $R_n$ of the liquid crystal display panel 1, and is inputted to the driving semiconductor devices IC1 to IC4 (source drivers) and IC5 (gate driver). And, by applying the driving signal to source lines and gate lines through the wiring patterns (not shown) provided on the liquid crystal display panel 1, an image according to the driving signal is displayed on the display region 2 of the liquid crystal display panel 1.

Recently, the source drivers and the gate drivers provided on the liquid crystal display panel 1 have increased as definition of a screen of the liquid crystal display device becomes higher. And, when the source drivers and the gate drivers increase, the electrode terminals $R_1$ to $R_n$ and $T_1$ to $T_n$ formed on the liquid crystal display panel 1 and the printed circuit board PCB1, respectively, increase, for example. Correspondingly, the wiring patterns $P_1$ to $P_n$ of the flexible printed circuit board FPC1 for electrically connecting the printed circuit board PCB1 and the liquid crystal display panel 1 also increase, for example. On the other hand, it is required to provide a smaller liquid crystal display module L for obtaining a smaller image display device. Therefore, recently, each of the electrode terminals provided on the liquid crystal display panel 1 and the printed circuit board PCB1 tends to be finely formed, and each of the wiring patterns of the flexible printed circuit boards FPC1 to FPC4 tends to be formed by fine patterns. In this case, however, by using a conventional process in which the alignment between the liquid crystal display panel 1 and the flexible printed circuit boards FPC1 to FPC4 is performed by using the circular reference markers N1 and the circular alignment markers N2, a problem might arise in the electrical connection between the liquid crystal display panel 1 and the printed circuit board PCB1 when rotational misalignment beyond tolerance occurs in θ direction around Z-axis. Hereinafter, the problem which might arise when the rotational misalignment beyond tolerance in θ direction around Z-axis occurs in the flexible printed circuit board FPC1 is described in detail with reference to FIGS. 15(a) and 15(b).

FIGS. 15(a) and 15(b) are views illustrated in association with the schematic views shown in FIGS. 13(a) and 13(b), schematically showing a condition in which the rotational misalignment beyond tolerance in θ direction around Z-axis occurs in the flexible printed circuit board FPC1, in which FIG. 15(a) is a plan view and FIG. 15(b) is a cross-sectional view taken along A-A' line in FIG. 15(a). The flexible printed circuit board FPC1 is perspectively shown as in FIGS. 13(a), 13(b) and FIGS. 14(a), 14(b). X-axis, Y-axis, and Z-axis directions in FIGS. 15(a) and 15(b) are defined as shown in the drawings (Z-axis direction is a direction perpendicular to the drawing surface).

As appreciated from FIGS. 15(a) and 15(b), when the flexible printed circuit board FPC1 greatly rotates in θ direction around Z-axis, and is bonded to the liquid crystal display panel 1 such that the reference markers N1 are located inward relative to and in contact with the alignment markers N2, a problem that the electrode terminals $T_1$ to $T_n$ of the printed circuit board PCB1 and the wiring patterns $P_1$ to $P_n$ of the flexible printed circuit board FPC1 are not properly electrically connected to each other might arise when the flexible printed circuit board FPC1 is bonded to the printed circuit board PCB1. In FIGS. 15(a) and 15(b), specifically, the conductive patterns $P_n$ and $P_{n-1}$ of the flexible printed circuit board FPC1 are positioned outside the anisotropic conductive adhesive 4B provided on the printed circuit board PCB1, and therefore, are not electrically connected to the electrode terminals $T_n$ and $T_{n-1}$ of the printed circuit board PCB1.

Therefore, there has been a problem that the conventional circular reference markers N1 and alignment markers N2 for alignment can not cope with the misalignment beyond tolerance in a rotational direction. This has been significant, especially when the flexible printed circuit board FPC1 is elongated in Y-axis direction. This is because, even if the misalignment of the flexible printed circuit board FPC1 in X-axis direction occurring when this rotates in θ direction around Z-axis is small on the liquid crystal display panel 1 side, the misalignment increases in proportion to a length of the flexible printed circuit board FPC1 in Y-axis direction, on the printed circuit board PCB1 side.

DISCLOSURE OF THE INVENTION

The present invention is aimed at solving the above-described problem. And an object of the present invention is to provide a liquid crystal display device capable of inhibiting rotational misalignment between a liquid crystal display panel and a flexible printed circuit board.

In order to achieve the above object, according to the present invention, there is provided a liquid crystal display device comprising a liquid crystal display panel provided with one or more electrode terminals and a pair of reference markers on a non-display region thereof, a flexible printed circuit board provided with alignment markers corresponding to the reference markers, and a printed circuit board having one or more electrode terminals, the reference markers being located inward relative to the alignment markers and the electrode terminals of the liquid crystal display panel and the electrode terminals of the printed circuit board being connected to each other through wiring of the flexible printed circuit board, wherein the alignment markers are elongated holes having long axes at least in one direction.

In such a configuration, since relative positions of the reference markers provided on the liquid crystal display panel and the alignment markers provided on the flexible printed circuit board are severely restricted in a direction of a short axis of the alignment markers, it becomes possible to inhibit rotational misalignment between the flexible printed circuit board and the liquid crystal display panel.

In this case, the alignment markers are disposed such that the long axes thereof are parallel to each other.

And, in this case, the alignment markers are disposed such that the long axes thereof are aligned.

And, in this case, the alignment markers each has at least a pair of straight-line portions parallel to the long axes thereof.

And, in this case, the alignment markers are disposed such that the long axes thereof are perpendicular to one of axes of the electrode terminal of the liquid crystal display panel.

In such a configuration, since the relative positions of the reference markers provided on the liquid crystal display panel and the alignment markers provided on the flexible printed circuit board are restricted more severely, it becomes possible to further inhibit the rotational misalignment between the flexible printed circuit board and the liquid crystal display panel.

In the above-described case, the alignment markers are rectangular elongated holes.

And, in the above-described case, the alignment markers are parallelogram-shaped elongated holes.

And, in the above-described case, the alignment markers are elliptical shaped elongated holes.

And, in the above-described case, the alignment markers are lozenge-shaped elongated holes.

In such a configuration, the alignment markers can be formed on the flexible printed circuit board by an easy method.

The object, as well as other objects, features and advantages of the present invention will become more apparent from the following detailed description of the preferred embodiments taken with reference to the accompanying drawings.

BRIEF DESCRIPTION OF THE DRAWINGS

FIGS. 1(a) and 1(b) are views schematically showing a substantial part of a liquid crystal display module L according to a first embodiment of the present invention, in which FIG. 1(a) is a plan view, and FIG. 1(b) is a cross-sectional view taken along line B-B' in FIG. 1(a);

FIGS. 2(a) and 2(b) are views illustrated in association with the schematic views shown in FIGS. 1(a) and 1(b), schematically showing a condition before the liquid crystal display panel 1 and the printed circuit board PCB1 are integrated with each other by means of the flexible printed circuit board FPC1, in which FIG. 2(a) is a plan view, and FIG. 2(b) is a cross-sectional view taken along line B-B' in FIG. 2(a);

FIGS. 10(a) and 10(b) are views schematically showing a substantial part of the liquid crystal display module L according to an eighth embodiment of the present invention, in which FIG. 10(a) is a plan view and FIG. 10(b) is a cross-sectional view taken along line C-C' in FIG. 10(a);

FIGS. 15(*a*) and 15(*b*) are views showing a condition in which rotational misalignment beyond tolerance in θ direction around Z-axis occurs in the flexible printed circuit board FPC1, in which FIG. 15(*a*) is a plan view and FIG. 15(*b*) is a cross-sectional view taken along line A-A' in FIG. 15(*a*).

BEST MODE FOR CARRYING OUT THE INVENTION

Hereinafter, embodiments of the present invention will be described with reference to the drawings.

First Embodiment

Figures 1A, 1B:
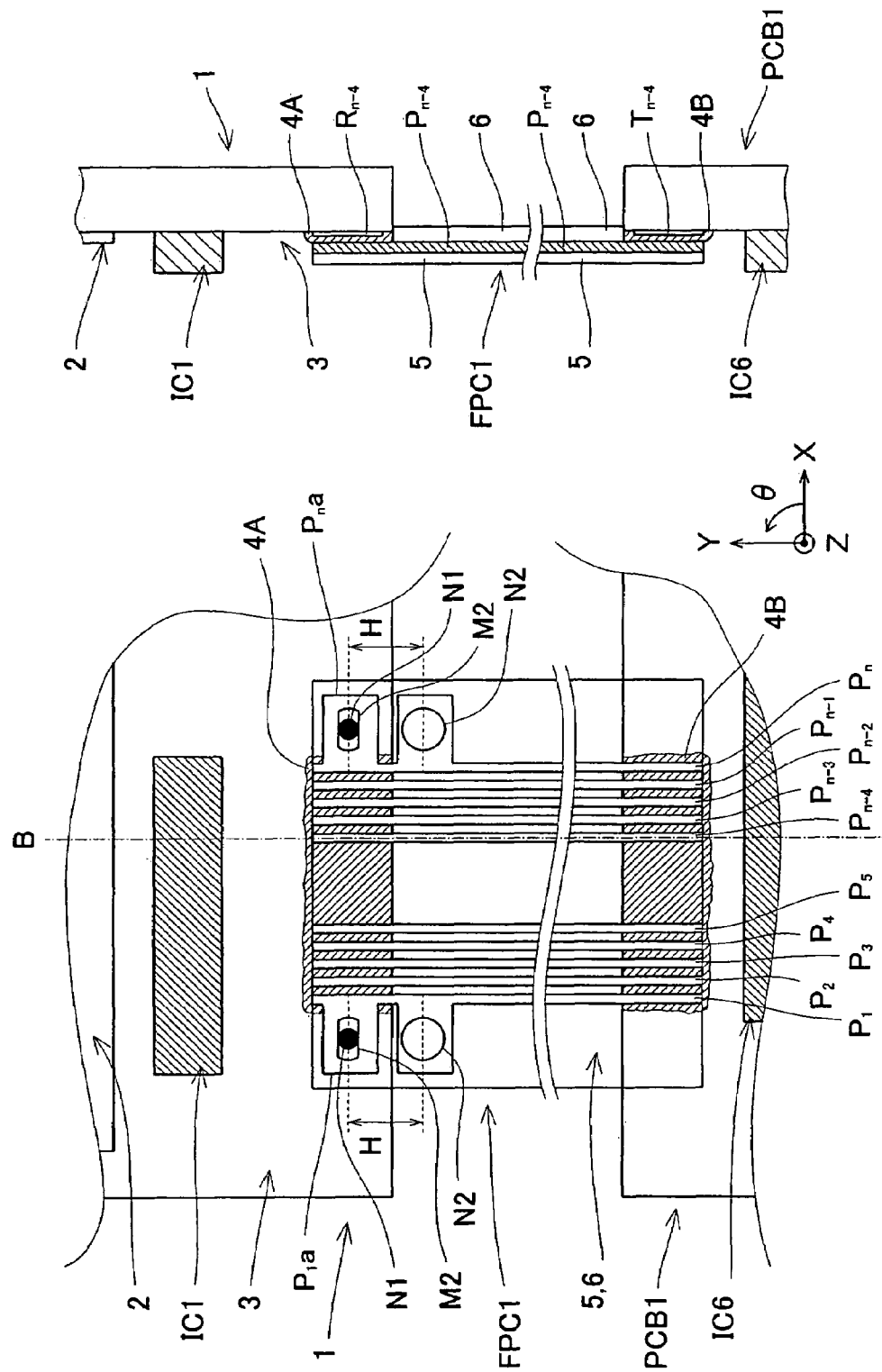
Figures 2A, 2B:
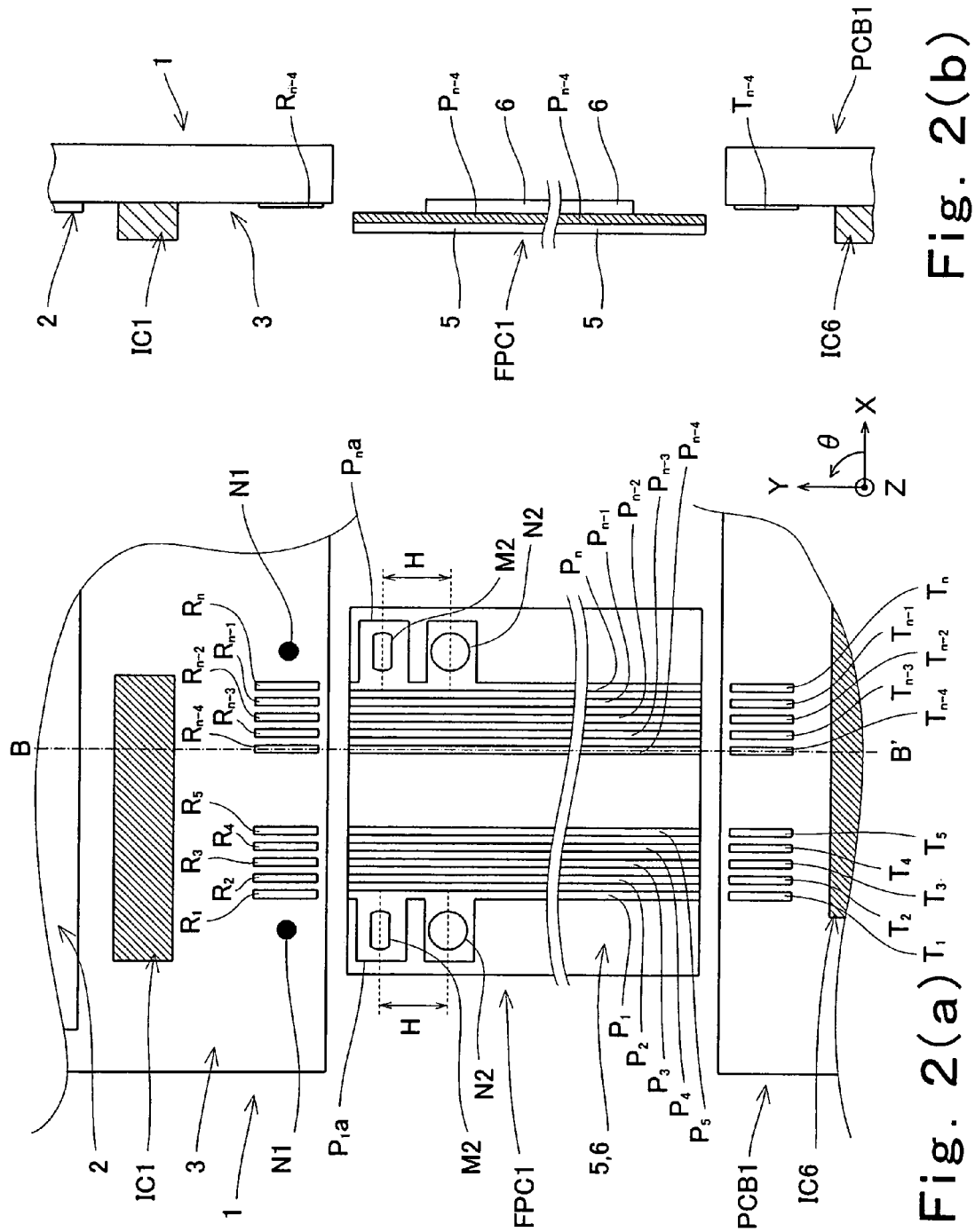
Figure 3:
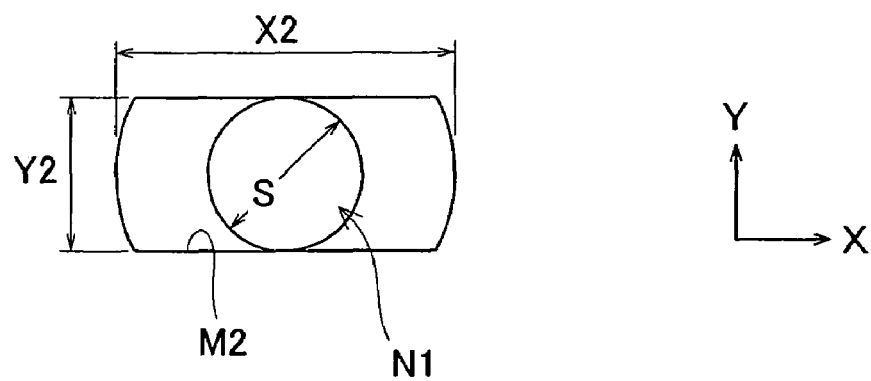
FIG. 3 is a plan view schematically showing a shape of an alignment marker M2 according to the first embodiment of the present invention.

FIGS. 1(*a*) and 1(*b*) are views schematically showing a substantial part of a liquid crystal display module L according to a first embodiment of the present invention, in which FIG. 1(*a*) is a plan view, and FIG. 1(*b*) is a cross-sectional view taken along line B-B' in FIG. 1(*a*). And, FIGS. 2(*a*) and 2(*b*) are views illustrated in association with the schematic views shown in FIGS. 1(*a*) and 1(*b*), schematically showing a condition before the liquid crystal display panel 1 and the printed circuit board PCB1 are integrated with each other by means of the flexible printed circuit board FPC1, in which FIG. 2(*a*) is a plan view, and FIG. 2(*b*) is a cross-sectional view taken along line B-B' in FIG. 2(*a*). Furthermore, FIG. 3 is an enlarged plan view showing a shape of one of alignment markers M2 according to the first embodiment of the present invention. The flexible printed circuit board FPC1 in FIGS. 1(*a*), 1(*b*) and FIGS. 2(*a*), 2(*b*) is perspectively shown. X-axis, Y-axis, and Z-axis directions (Z-axis direction is a direction perpendicular to a drawing surface) in FIGS. 1(*a*), 1(*b*), and FIGS. 2(*a*), 2(*b*) are defined as shown in the drawings.

Figures 13A, 13B:
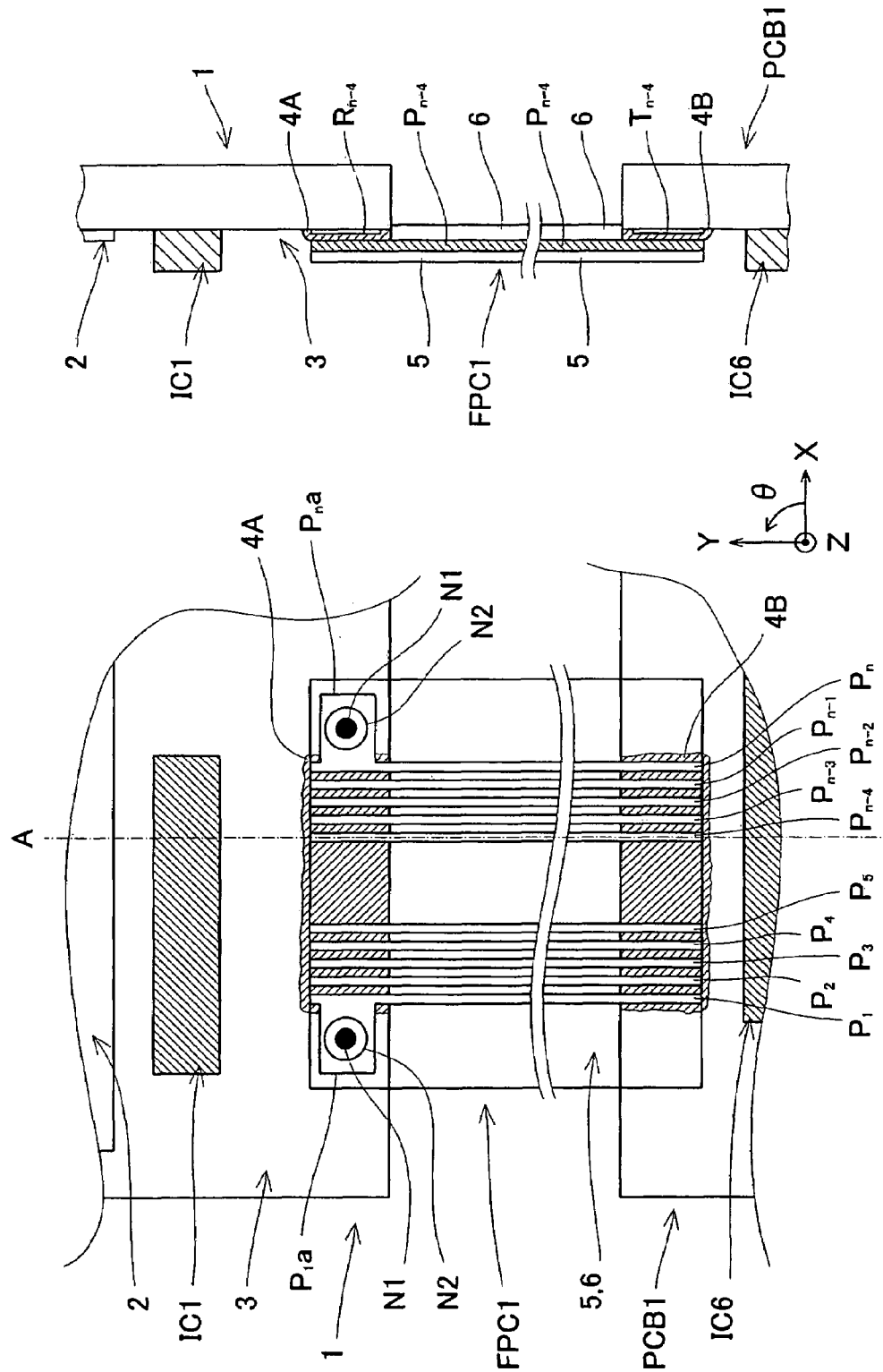
FIGS. 13(*a*) and 13(*b*) are views schematically showing a substantial part of the liquid crystal display module L shown in FIG. 12, in which FIG. 13(*a*) is a plan view and FIG. 13(*b*) is a cross-sectional view taken along line A-A' in FIG. 13(*a*)
Figures 14A, 14B:
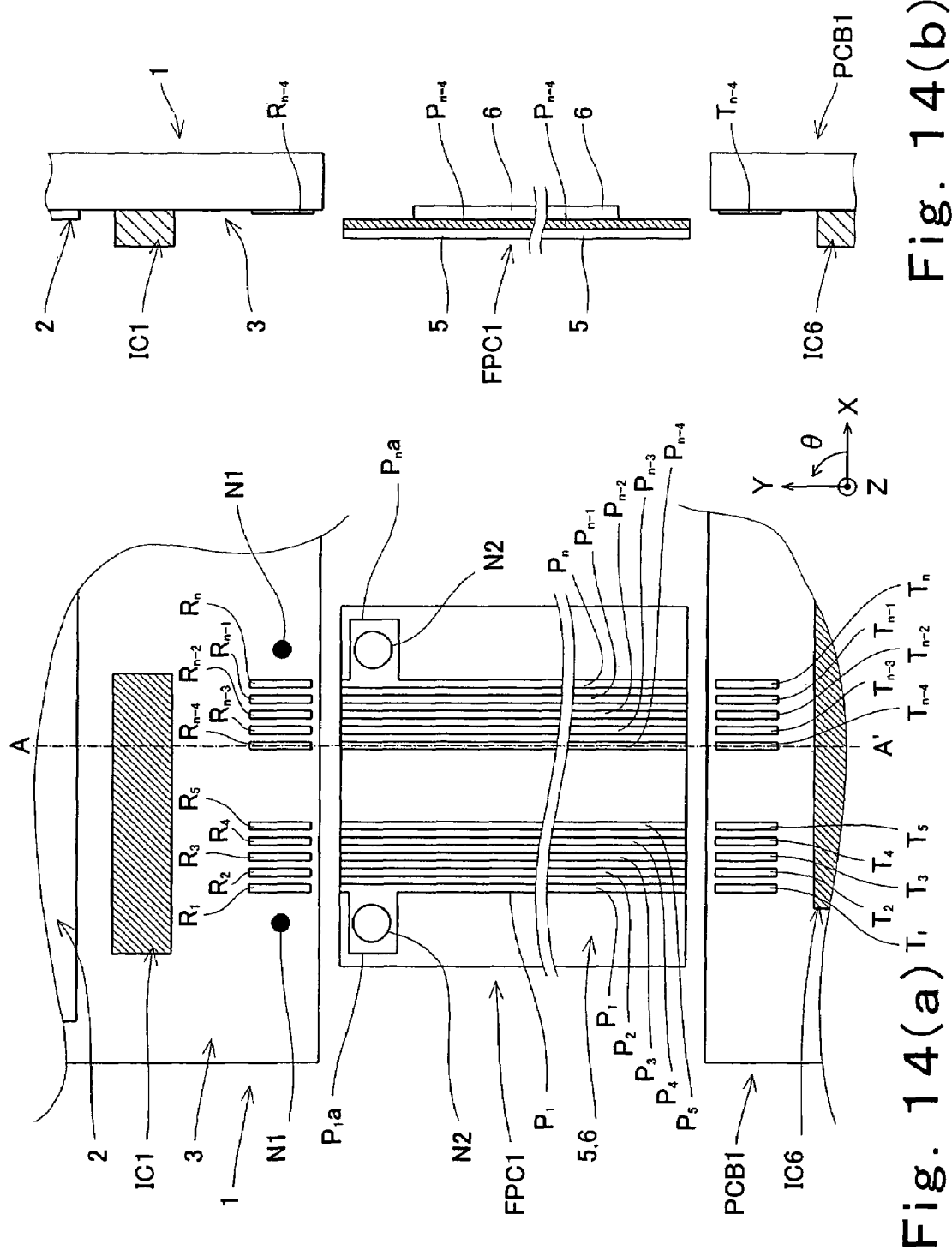
FIGS. 14(*a*) and 14(*b*) are views illustrated in association with the schematic views shown in FIGS. 13(*a*) and 13(*b*), schematically showing a condition before the liquid crystal display panel 1 and the printed circuit board PCB1 are integrated with each other by means of the flexible printed circuit board FPC1, in which FIG. 14(*a*) is a plan view, and FIG. 14(*b*) is a cross-sectional view taken along line A-A' in FIG. 14(*a*)

Structures of the liquid crystal display panel 1 and the printed circuit board PCB1 according to the present embodiment are identical to those in the conventional example shown in FIGS. 13(*a*), 13(*b*) and FIGS. 14(*a*), 14(*b*). So, herein, the flexible printed circuit board FPC1 of the embodiment of the present invention is described in detail.

As shown in FIGS. 1(*a*), 1(*b*) and FIGS. 2(*a*), 2(*b*), herein, the flexible printed circuit board FPC1 is rectangular and has a three-layer structure in which wiring patterns $P_1$ to $P_n$ obtained by forming copper foil in a predetermined shape by etching or the like, a cover film 5, and a base film 6 each of which is made of semi-transparent insulative resin such as polyimide are laminated. A general size of the flexible printed circuit board FPC1 is 20 to 50 mm in X-axis direction and 10 to 60 mm in Y-axis direction. As shown in FIG. 2(*a*), the wiring patterns $P_1$ to $P_n$ are formed to extend from one side of the flexible printed circuit board FPC1, which is parallel to X-axis direction, to the other side thereof to have substantially constant pattern widths and pattern spacings. And, rectangular conductive patterns $P_1a$ and $P_na$ extend in opposite directions from side portions of the wiring patterns $P_1$ and $P_n$ on the liquid crystal display panel 1 side to be each spaced a predetermined distance apart from an end of the flexible printed circuit board FPC1. Furthermore, predetermined elongated-hole shaped alignment markers M2 to be described below having major and short axes are formed on the conductive patterns $P_1a$ and $P_na$. The alignment markers M2 are formed such that the long axes thereof are perpendicular to a longitudinal direction of the wiring patterns $P_1$ to $P_n$ and aligned. And, as shown in FIG. 2(*b*), in the flexible printed circuit board FPC1, the base film 6 is rectangular shaped to have sides substantially parallel to two sides of the flexible printed circuit board FPC1 which are parallel to X-axis direction, with a predetermined distance therefrom. Thereby, end portions of the wiring patterns $P_1$ to $P_n$ are exposed so as to be electrically connected to external electrode terminals.

FIG. 3 is an enlarged plan view showing one of the alignment markers M2. X-axis and Y-axis directions are defined as shown in FIG. 3.

As shown in FIG. 3, the predetermined elongated-hole shaped alignment marker M2 has a pair of long sides substantially parallel to each other. And, the shape of the alignment marker M2 is obtained by cutting upper and lower portions in Y-axis direction of a conventional circular alignment marker N2 shown in FIGS. 13(*a*), 13(*b*) and 14(*a*), 14(*b*) such that a length Y2 shown in FIG. 3 is equal to the diameter S of the circular reference marker N1 formed on the conventional liquid crystal display panel 1 shown in FIGS. 13(*a*), 13(*b*) and 14(*a*), 14(*b*).

The alignment marker M2 is obtained by forming metal foil such as copper foil by etching or the like, and an inner side thereof is made of a semi-transparent insulative resin such as polyimide. This enables alignment between the reference marker N1 formed on the liquid crystal display panel 1 and the alignment marker M2 of the flexible printed circuit board FPC1.

In the present embodiment, as shown in FIGS. 1(*a*), 1(*b*) and FIGS. 2(*a*), 2(*b*), the conventional circular alignment markers N2 are provided at positions spaced a distance H apart from the centers of a right and left pair of alignment markers M2 in Y-axis direction in order to cope with the alignment between the liquid crystal display panel 1 and the flexible printed circuit board FPC1 by using the automatic alignment device or the like.

In the above-structured flexible printed circuit board FPC1, the alignment of the alignment marker M2 of the flexible printed circuit board FPC1 with the reference marker N1 of the liquid crystal display panel 1 is identical to that of the conventional process. This can be accomplished by locating the reference marker N1 within the alignment marker M2. And, if misalignment in θ direction around Z-axis occurs, it should also occur in Y-axis direction. Since the alignment marker M2 is the elongated-hole shaped restricted in Y-axis direction, it is possible to inhibit misalignment in θ direction around Z-axis more severely than in the conventional process, even when the alignment is manually performed. When the alignment is performed by the automatic alignment device or the like, the device performs the alignment between the liquid crystal display panel 1 and the flexible printed circuit board FPC1 by reading coordinates of the centers of the alignment marker N2 and the reference marker N1 and taking the distance H from the center of the alignment marker M2 to the center of the alignment marker N2 into account.

As described above, according to the present embodiment, the misalignment of the flexible printed circuit board FPC1 in θ direction around Z-axis occurring when this is bonded to the liquid crystal display panel 1 is minimized, even when the alignment is manually performed by hand. Consequently, it becomes possible to properly electrically connect the flexible printed circuit boards FPC1 to FPC4 to the printed circuit board PCB1 when the flexible printed circuit boards FPC1 to FPC4 are bonded to the printed circuit board PCB1, thereby decreasing occurrence of malfunction of the liquid crystal display module L.

And, in the present embodiment, since straight-line portions are formed on the alignment marker M2 of the flexible printed circuit board FPC1, confirmation that the alignment marker M2 has a shape according to a designed value and that variation in dimension between production lots does not exist can be controlled by only measuring dimension of the straight-line portions or dimensions of X2 and Y2 of the alignment marker M2. As a result, it becomes unnecessary to control a curve R, unlike in the circular alignment marker such as the conventional alignment marker N2, thereby enabling easier control of the shape of the alignment marker.

Second Embodiment

Figure 4:
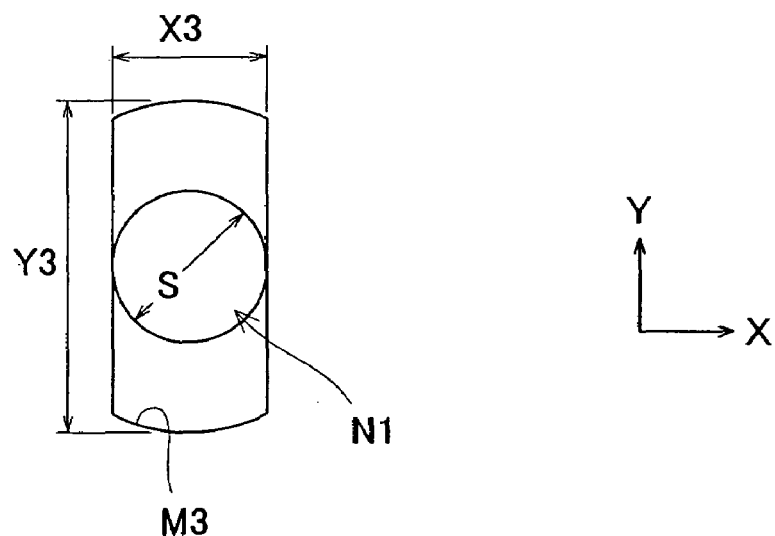
FIG. 4 is a plan view schematically showing a shape of an alignment marker M3 according to a second embodiment of the present invention.

FIG. 4 is an enlarged plan view showing a shape of an alignment marker M3 according to a second embodiment of the present invention. Here, X-axis and Y-axis directions are defined as shown in FIG. 4.

A structure of the flexible printed circuit board FPC1 according to this embodiment is identical to that of the flexible printed circuit board FPC1 according to the first embodiment of the present invention shown in FIGS. 1(*a*), 1(*b*) and FIGS. 2(*a*), 2(*b*), except the shape of the alignment markers M3. Therefore, the shape of one of the alignment markers M3 which characterizes the structure of the present invention is shown in FIG. 4. And, third to seventh embodiments are shown in the same manner.

The alignment marker M3 shown in FIG. 4 has a shape obtained by rotating the alignment marker M2 shown in FIG. 3 in the first embodiment by 90 degrees around Z-axis. So, the alignment marker M3 is formed such that lengths of a long axis and a short axis thereof are Y3 and X3, respectively, and the long axis thereof is provided in parallel with a longitudinal direction of the wiring patterns $P_1$ to $P_n$. And, the length of the long axis Y3 of the alignment marker M3 is set considering only misalignment of the flexible printed circuit board FPC1 in Y-axis direction, and the length of the short axis X3 of the alignment marker M3 is set to be equal to the diameter S of the reference marker N1.

In such a configuration also, it is possible to obtain the same effect as in the first embodiment. Furthermore, since the length of the long axis Y3 of the alignment marker M3 is set considering only misalignment of the flexible printed circuit board FPC1 in Y-axis direction, and is made longer than that of the long axis X2 of the alignment marker M2 of the first embodiment, it becomes possible to manually perform the alignment more easily.

Third Embodiment

Figure 5:
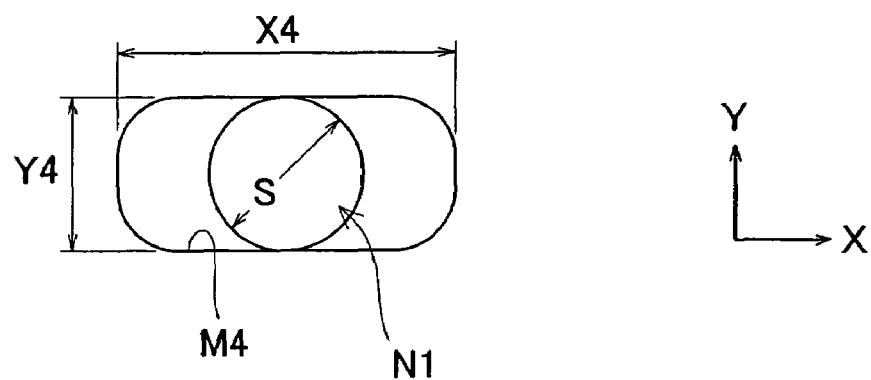
FIG. 5 is a plan view schematically showing a shape of an alignment marker M4 according to a third embodiment of the present invention.

FIG. 5 is an enlarged plan view showing a shape of an alignment marker M4 according to a third embodiment of the present invention. X-axis and Y-axis directions are defined as shown in FIG. 5.

The alignment marker M4 shown in FIG. 5 has a shape obtained by smoothly chamfering four corners of a rectangular elongated hole in which lengths of a long axis and a short axis thereof are X4 and Y4, respectively. And the length of the long axis X4 of the alignment marker M4 is set considering only misalignment of the flexible printed circuit board FPC1 in X-axis direction, and the length of the short axis Y4 of the alignment marker M4 is set to be equal to the diameter S of the reference marker N1.

In such a configuration also, it is possible to obtain the same effect as in the first embodiment. Furthermore, since the length of the long axis X4 of the alignment marker M4 is set considering only misalignment of the flexible printed circuit board FPC1 in X-axis direction and is made longer than that of the long axis X2 of the alignment marker M2 of the first embodiment, it becomes possible to manually perform the alignment more easily.

Fourth Embodiment

Figure 6:
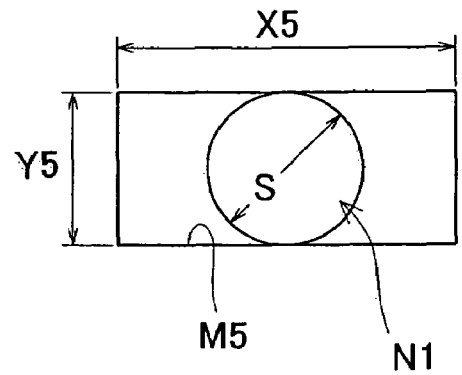
FIG. 6 is a plan view schematically showing a shape of an alignment marker M5 according to a fourth embodiment of the present invention.

FIG. 6 is an enlarged plan view showing a shape of an alignment marker M5 according to a fourth embodiment of the present invention. X-axis and Y-axis directions are defined as shown in FIG. 6.

The alignment marker M5 shown in FIG. 6 is a rectangular elongated hole in which lengths of a long axis and a short axis thereof are X5 and Y5, respectively. And the length of the long axis X5 of the alignment marker M5 is set considering only misalignment of the flexible printed circuit board FPC1 in X-axis direction, and the length of the short axis Y5 of the alignment marker M5 is set to be equal to the diameter S of the reference marker N1.

In such a configuration also, it is possible to obtain the same effect as in the first embodiment. Furthermore, since the length of the long axis X5 of the alignment marker M5 is set considering only misalignment of the flexible printed circuit board FPC1 in X-axis direction and is made longer than that of the long axis X2 of the alignment marker M2 of the first embodiment, it becomes possible to manually perform the alignment more easily.

Fifth Embodiment

Figure 7:
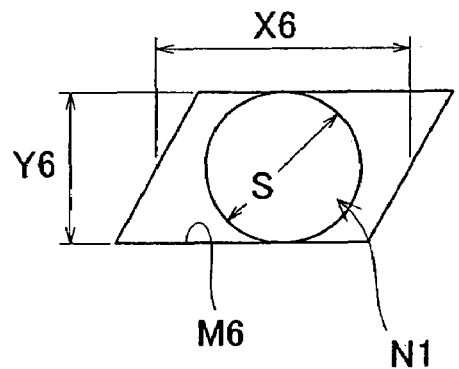
FIG. 7 is a plan view schematically showing a shape of an alignment marker M6 according to a fifth embodiment of the present invention.

FIG. 7 is an enlarged plan view showing a shape of an alignment marker M6 according to a fifth embodiment of the present invention. X-axis and Y-axis directions are defined as shown in FIG. 7.

The alignment marker M6 shown in FIG. 7 is a parallelogram-shaped elongated hole in which lengths of a long axis and a short axis thereof are X6 and Y6, respectively. And, the length of the long axis X6 of the alignment marker M6 is set considering only misalignment of the flexible printed circuit board FPC1 in X-axis direction, and the length of the short axis Y6 of the alignment marker M6 is set to be equal to the diameter S of the reference marker N1.

In such a configuration also, it is possible to obtain the same effect as in the first embodiment. Furthermore, since the length of the long axis X6 of the alignment marker M6 is set considering only misalignment of the flexible printed circuit board FPC1 in X-axis direction and is made longer than that of the long axis X2 of the alignment marker M2 of the first embodiment, it becomes possible to manually perform the alignment more easily.

Sixth Embodiment

Figure 8:
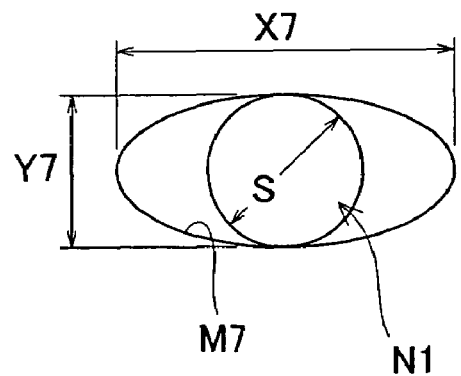
FIG. 8 is a plan view schematically showing a shape of an alignment marker M7 according to a sixth embodiment of the present invention.

FIG. 8 is an enlarged plan view showing a shape of an alignment marker M7 according to a sixth embodiment of the present invention. X-axis and Y-axis directions are defined as shown in FIG. 8.

The alignment marker M7 shown in FIG. 8 is an elliptical shaped elongated hole in which lengths of a long axis and a short axis thereof are X7 and Y7, respectively. The elliptical shaped alignment marker M7 has a shape having as a pair of parallel long side portions as possible, so as to be similar in shape to the alignment markers M2 to M6 shown in the first to fifth embodiments each having straight-line portions. And, the long axis X7 of the alignment marker M7 is set considering only misalignment of the flexible printed circuit board FPC1 in X-axis direction, and the short axis Y7 of the alignment marker M7 is set to be equal to the diameter S of the reference marker N1.

In such a configuration also, it is possible to obtain the same effect as in the first embodiment. Furthermore, since the length of the long axis X7 of the alignment marker M7 is set considering only misalignment of the flexible printed circuit board FPC1 in X-axis direction and is made longer than that of the long axis X2 of the alignment marker M2 of the first embodiment, it becomes possible to manually perform the alignment more easily.

Seventh Embodiment

Figure 9:
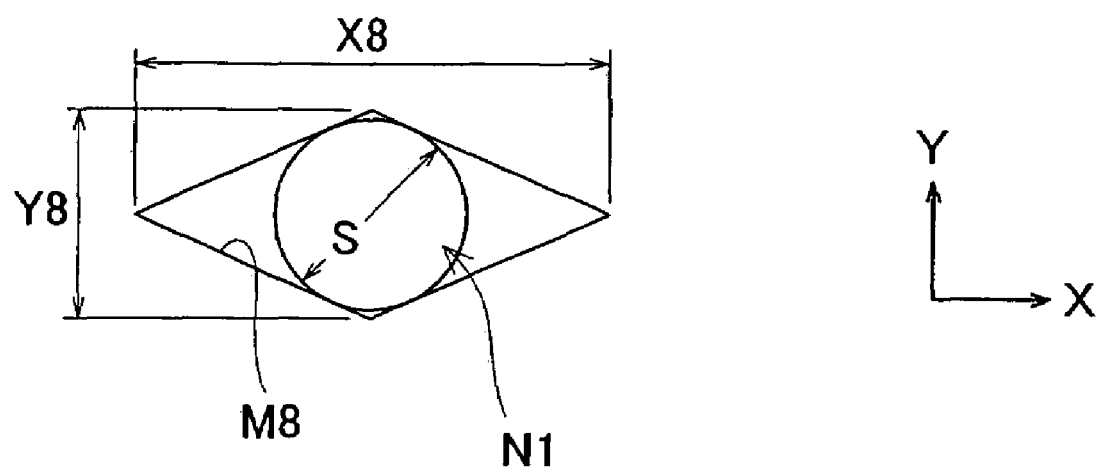
FIG. 9 is a plan view schematically showing a shape of an alignment marker M8 according to a seventh embodiment of the present invention.

FIG. 9 is an enlarged plan view showing a shape of an alignment marker M8 according to a seventh embodiment of the present invention. X-axis and Y-axis directions are defined as shown in FIG. 9.

The alignment marker M8 shown in FIG. 9 is a lozenge-shaped elongated hole in which lengths of a long axis and a short axis thereof are X8 and Y8, respectively. And, the long axis X8 of the alignment marker M8 is set considering only misalignment of the flexible printed circuit board FPC1 in X-axis direction, and the short axis Y8 of the alignment marker M8 is set to be equal to the diameter S of the reference marker N1.

In such a configuration also, it is possible to obtain the same effect as in the first embodiment. Furthermore, since the length of the long axis X8 of the alignment marker M8 is set to the length considering only misalignment of the flexible printed circuit board FPC1 in X-axis direction and is made longer than that of the long axis X2 of the alignment M2 in the first embodiment, it becomes possible to manually perform the alignment more easily.

Eighth Embodiment

The reference markers N1 are formed in alignment and spaced a constant distance apart from an end of the liquid crystal display panel 1, which is near these markers. And, the alignment markers M2 to M8 are formed on the flexible printed circuit board FPC1, at positions corresponding to the reference markers N1. However, by obliquely disposing the reference markers N1 and the alignment markers M2 to M8 with respect to the liquid crystal display panel 1 and the flexible printed circuit board FPC1, occurrence of rotational misalignment in θ direction around Z-axis in the flexible printed circuit board FPC1 is inhibited more effectively.

Figures 10A, 10B:
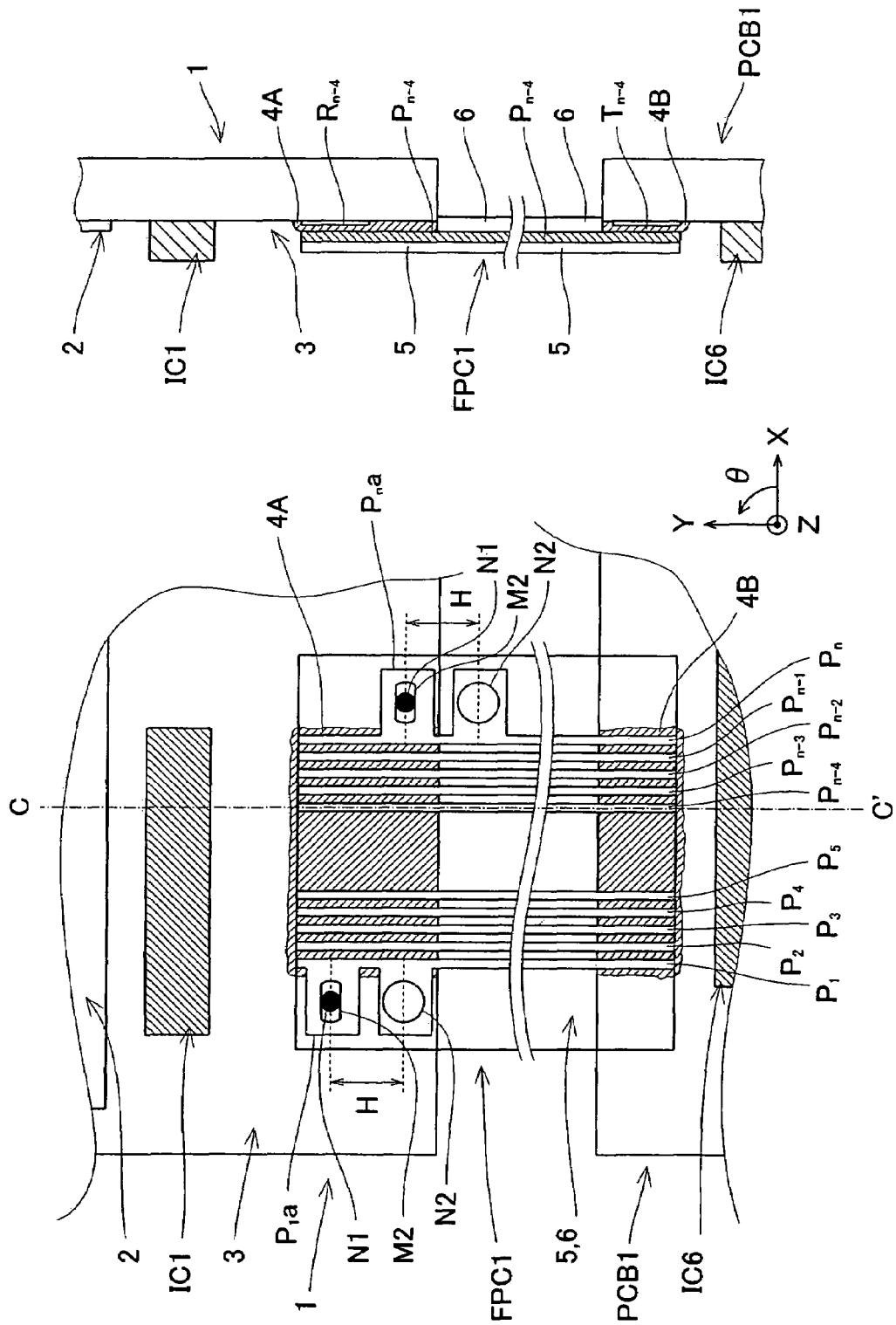
Figures 11A, 11B:
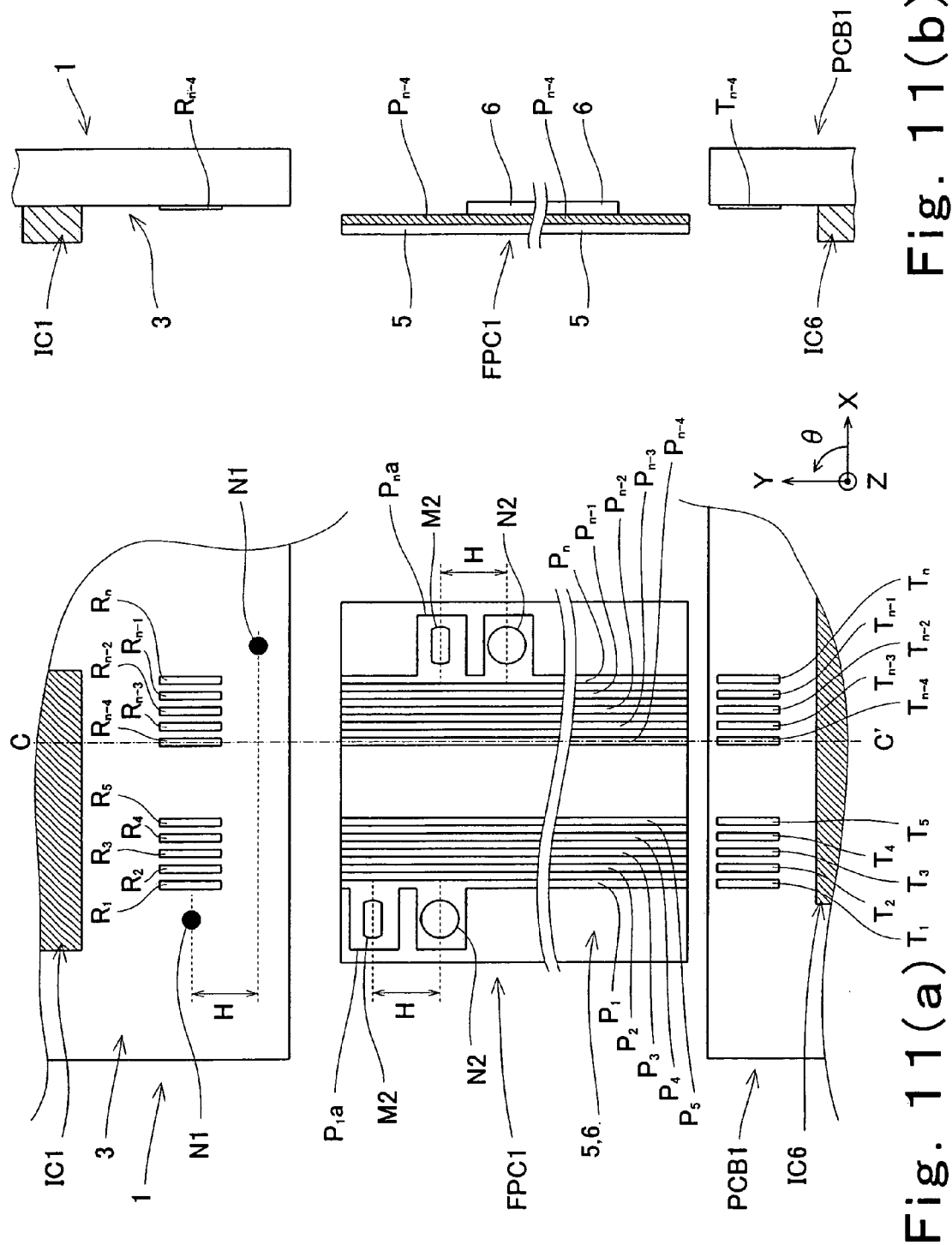
FIGS. 11(a) and 11(b) are views illustrated in association with the schematic views shown in FIGS. 10(a) and 10(b), schematically showing a condition before the liquid crystal display panel 1 and the printed circuit board PCB1 are integrated with each other by means of the flexible printed circuit board FPC1, in which FIG. 11(*a*) is a plan view and FIG. 11(*b*) is a cross-sectional view taken along line C-C' in FIG. 11(*a*)
Figure 12:
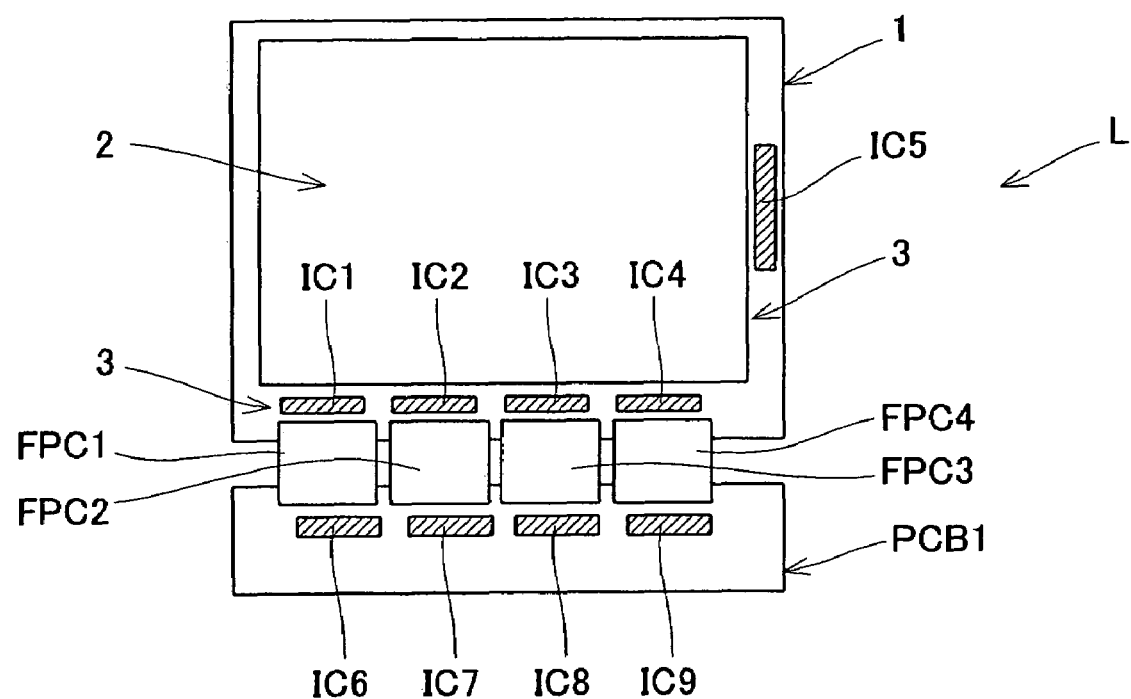
FIG. 12 is a plan view schematically showing a structure of the conventional liquid crystal display module L.

FIGS. 10(a) and 10(b) are views schematically showing a substantial part of the liquid crystal display module L according to an eighth embodiment of the present invention, in which FIG. 10(a) is a plan view and FIG. 10(b) is a cross-sectional view taken along line C-C' in FIG. 10(a). And, FIGS. 11(a) and 11(b) are views illustrated in association with the schematic views shown in FIGS. 10(a) and 10(b), schematically showing a condition before the liquid crystal display panel 1 and the printed circuit board PCB1 are integrated with each other by means of the flexible printed circuit board FPC1, in which FIG. 11(a) is a plan view and FIG. 11(b) is a cross-sectional view taken along line C-C' of FIG. 11(a). In FIGS. 10(a), 10(b) and FIGS. 11(a), 11(b) also, the flexible printed circuit board FPC1 is perspectively shown as in FIGS. 1(a), 1(b) and FIGS. 2(a), 2(b). X-axis, Y-axis, and Z-axis directions (Z-axis direction is a direction perpendicular to the drawing surface) in FIGS. 10(a), 10(b) and FIGS. 11(a), 11(b) are defined as shown in the drawings.

Herein, a case where the alignment markers M2 are formed on the flexible printed circuit board FPC1 is described as an example. And, the same applies to the alignment markers M3 to M8.

In the present embodiment, as shown in FIGS. 10(a), 10(b) and FIGS. 11(a), 11(b), the reference markers N1 provided on the liquid crystal display panel 1 are formed such that one reference marker N1 and the other reference marker N1 are spaced a distance H apart from each other. That is to say, the reference markers N1 are obliquely disposed with respect to the liquid crystal display panel 1. And, the alignment markers M2 are formed on the flexible printed circuit board FPC1 at positions corresponding to the reference markers N1 provided on the liquid crystal display panel 1. In other words, the alignment markers M2 are obliquely disposed with respect to the flexible printed circuit board FPC1. In other respects, the eighth embodiment is identical to the first embodiment.

In such a structure, since the reference markers N1 and the alignment markers M2 are obliquely disposed so that distances between the reference markers N1 and N1 and between the alignment markers M2 and M2 are longer than those in the first embodiment, it is possible to obtain the effect similar to or better than that of the first embodiment. Furthermore, as in the second to seventh embodiments, it becomes possible to manually perform the alignment more easily.

Although in the above-described first to eighth embodiments, the reference markers N1 are provided on the liquid crystal display panel 1, and the alignment markers M2 to M8 are provided on the flexible printed circuit board FPC1, this relationship may be reversed.

And, although the alignment markers M2 to 8 of the flexible printed circuit boards FPC1 to FPC4 are formed by, for example, etching metal foil such as copper foil, this may be formed by through-holes formed by using metal mold or the like. By forming the alignment markers M2 to 8 by, for example, etching the metal foil such as copper foil, variation in precision of each of the shapes of the alignment markers M2 to 8 and variation in each of the shapes between production lots can be advantageously reduced as compared to the case where the through-holes are formed on the flexible printed circuit board FPC1 to FPC4. On the other hand, by obtaining the alignment markers M2 to 8 by forming through-holes on the flexible printed circuit boards FPC1 to FPC4, the positions of the alignment markers M2 to 8 can be easily changed advantageously.

Furthermore, although the liquid crystal display panel is illustrated as an example of an image display element in the above-described first to eighth embodiments, the image display element is not limited to this. And, the present invention is widely applicable to connection of the wiring boards each having electrode terminals.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the sprit of the invention.

INDUSTRIAL APPLICABILITY

A liquid crystal display device according to the present invention is useful as an image display device of an information device, such as consumer and industrial notebook type personal computer, word processor or the like, a portable television, a video movie, a car navigation system or the like.

The invention claimed is:

1. A liquid crystal display device comprising:
a liquid crystal display panel provided with one or more electrode terminals and a pair of reference markers on a non-display region thereof;
a flexible printed circuit board provided with alignment markers corresponding to the reference markers; and
a printed circuit board having one or more electrode terminals, the reference markers being located inward relative to the alignment markers and the electrode terminals of the liquid crystal display panel and the electrode terminals of the printed circuit board being connected to each other through wiring of the flexible printed circuit board,
wherein the alignment markers are elongated holes having long axes at least in one direction, and
wherein the alignment markers are disposed such that the long axes thereof are perpendicular to one of axes of the electrode terminal of the liquid crystal display panel.

2. The liquid crystal display device according to claim 1, wherein the alignment markers are disposed such that the long axes thereof are parallel to each other.

3. The liquid crystal display device according to claim 1, wherein the alignment markers are disposed such that the long axes thereof are aligned.

4. The liquid crystal display device according to claim 1, wherein the alignment markers each has at least a pair of straight-line portions parallel to the long axes thereof.

5. The liquid crystal display device according to claim 1, wherein the alignment markers are rectangular elongated holes.

6. The liquid crystal display device according to claim 1, wherein the alignment markers are parallelogram-shaped elongated holes.

7. The liquid crystal display device according to claim 1, wherein the alignment markers are elliptical shaped elongated holes.

8. The liquid crystal display device according to claim 1, wherein the alignment markers are lozenge-shaped elongated holes.

* * * * *